United States Patent
Benner et al.

(10) Patent No.: US 10,061,001 B2
(45) Date of Patent: Aug. 28, 2018

(54) METHOD AND MEDICAL IMAGING APPARATUS OF DETERMINING TIME WINDOWS IN A SCAN SEQUENCE

(71) Applicant: Siemens Aktiengesellschaft, Munich (DE)

(72) Inventors: Thomas Benner, Erlangen (DE); Swen Campagna, Engelthal (DE); Thorsten Feiweier, Poxdorf (DE); Bernd Kuehn, Uttenreuth (DE); Thorsten Speckner, Erlangen (DE); Peter Speier, Erlangen (DE); Daniel Nico Splitthoff, Erlangen (DE)

(73) Assignee: Siemens Aktiengesellschaft, Munich (DE)

( * ) Notice: Subject to any disclaimer, the term of this patent is extended or adjusted under 35 U.S.C. 154(b) by 401 days.

(21) Appl. No.: 14/870,027

(22) Filed: Sep. 30, 2015

(65) Prior Publication Data

US 2016/0091585 A1  Mar. 31, 2016

(30) Foreign Application Priority Data

Sep. 30, 2014 (DE) .................. 10 2014 219 780

(51) Int. Cl.
*G01R 33/54* (2006.01)
*G01R 33/46* (2006.01)

(52) U.S. Cl.
CPC ............ *G01R 33/543* (2013.01); *G01R 33/46* (2013.01)

(58) Field of Classification Search
CPC ................... G01R 33/543; G01R 33/46
See application file for complete search history.

(56) References Cited

U.S. PATENT DOCUMENTS

| | | | |
|---|---|---|---|
| 6,515,478 B1 | 2/2003 | Wicklow et al. | |
| 7,218,113 B2 | 5/2007 | Feiweier et al. | |
| 8,111,069 B2 | 2/2012 | Feiweier | |
| 8,633,690 B2 * | 1/2014 | Feiweier | G01R 33/54 324/307 |
| 2010/0286802 A1 | 11/2010 | Feiweier et al. | |
| 2012/0217966 A1 | 8/2012 | Feiweier | |
| 2016/0091584 A1 * | 3/2016 | Feiweier | G01R 33/543 324/309 |
| 2017/0168128 A1 * | 6/2017 | Feiweier | G01R 33/3875 |

OTHER PUBLICATIONS

Meier et al., "Concomitant Field Terms for Asymmetric Gradient Coils: Consequences for Diffusion, Flow, and Echo-Planar Imaging," Magnetic Resonance in Medicine, vol. 60, pp. 128-134 (2008).
De Graaf et al., "Dynamic Shim Updating (DSU) for Multi-Slice Signal Acquisition," Proc. Intl. Soc. Mag. Reson. Med., vol. 10 (2002).

* cited by examiner

*Primary Examiner* — Rodney Bonnette
(74) *Attorney, Agent, or Firm* — Schiff Hardin LLP

(57) ABSTRACT

In a method for determining time windows in a scan sequence, in which values of setting parameters of a scan can be changed during a current scan without adversely affecting the scan data obtained with the scan, comprising the following a scan sequence is loaded into a control computer, that then determines the time windows in the scan sequence in which values of setting parameters can be changed during a current scan, on the basis of an analysis of useful coherences in the scan sequence. The determined time windows are stored or processed so as to be available to operate an imaging apparatus to execute the scan sequence.

11 Claims, 3 Drawing Sheets

METHOD AND MEDICAL IMAGING APPARATUS OF DETERMINING TIME WINDOWS IN A SCAN SEQUENCE

BACKGROUND OF THE INVENTION

Field of the Invention

The invention concerns a method for determining time windows in a scan sequence executed by a medical imaging apparatus, in which values of sequence control data can be changed during a current scan without adversely affecting the scan data obtained with the scan. The invention also concerns a method for operating a medical imaging examination apparatus using time windows of this kind, and to a corresponding medical imaging examination apparatus and an associated electronically readable data carrier encoded with programming instructions for implementing such methods.

Description of the Prior Art

Medical imaging examination apparatuses such as magnetic resonance apparatuses and computed tomography apparatuses are complex systems with a large number of technical subsystems. These include, in a magnetic resonance apparatus, a basic field magnet system, a gradient system, a shim system and a radio frequency transmission system as well as a radio frequency receiving system.

In order to generate images or spectroscopic data from an examination object with a magnetic resonance apparatus, the examination object is positioned in the scanner in a strong homogeneous basic magnetic field, also known as the $B_0$ field, generated by the basic field magnet system with a field strength of 0.2 Tesla to 7 Tesla or more, so that the nuclear spins in the object align along the basic magnetic field direction. In order to trigger nuclear spin resonance, radio frequency excitation signals (RF pulses) are radiated into the examination object with suitable antennas of the radio frequency transmission system, so that the nuclear spin of particular atoms stimulated to resonance by this radio frequency field are tilted through a particular flip angle relative to the magnetic field lines of the basic magnetic field. The nuclear spin resonance that is triggered, i.e. the radio frequency signals (also "magnetic resonance signals") emitted during the precession of the nuclear spin are detected by the radio frequency receiving system, typically digitized, and normally stored as complex number values (if a spatial reference is given) in a "k-space matrix" as "k-space data". For example, in single-voxel spectroscopy scans (without spatial reference), the digitized data are stored as complex time signals, also known as "FID data". On the basis of the k-space data or FID data, MR images can be reconstructed or spectroscopic data can be determined. For spatial encoding of the scan data, rapidly switched magnetic gradient fields are overlaid on the basic magnetic field by the gradient system. The shim system is intended to homogenize the magnetic fields.

All these technical modules must be suitably operated in a coordinated way by a control system. The adjustment and switching of the individual subsystems necessary for a particular imaging process must be undertaken by the control system at the right time point in each case. Typically, the volume to be imaged within an imaging sequence is recorded in subvolumes, for example, in 2-D imaging, in multiple slices or, in 3-D imaging, in multiple "slabs". The subvolumes recorded in this way are then assembled into an overall volume. A further definition of subvolumes can be given as "regions of interest" (ROI) or "volumes of interest" (VOI) defined, for example, by the operator. Furthermore, in magnetic resonance systems, additional subvolumes arise when determining local saturation regions or local preparation or labeling pulses.

As mentioned above, sequence control data are transmitted to the control device for coordinated control, typically based on a "scan protocol". These sequence control data define different functional subsequences of a complete scan sequence. In a magnetic resonance recording, for example, a first subsequence may be a pulse sequence in order to achieve a saturation locally in a particular region. Further subsequences can contain, for example, particular preparation pulses and yet further subsequences serve for successive excitation and for receiving the magnetic resonance signals in different slices or slabs.

Typical methods based on MR technology, such as tomographic imaging (MRT—magnetic resonance tomography) or spectroscopy (MRS—magnetic resonance spectroscopy) require "benign" ambient physical conditions in order to ensure the best possible quality in the data recorded. For example, this relates to the spatial homogeneity, temporal stability and the absolute accuracy of the relevant magnetic fields and radio frequency fields, that is, the main magnetic field ($B_0$) and the gradient and radio frequency fields ($B_1$).

Conventionally, deviations from ideal ambient conditions can at least partially be compensated for, for example, by system-specific settings known as "tune-ups", in particular with regard to eddy current-induced dynamic field disruptions or gradient sensitivities or by examination object-specific settings, particularly in relation to susceptibility-related static field disruptions or spatial variations of the radio frequency field. However, the compensation settings specified before the beginning of a scan conventionally remain valid throughout the entire scan ("static" adjustment).

For spatially variable ambient conditions that cannot be entirely compensated, this entails a compromise for data quality.

De Graaf et al. describe in "Dynamic Shim Updating (DSU) for Multi-Slice Signal Acquisition", Proc. Intl. Soc. Mag. Reson. Med. 10, p. 536, 2002, a rudimentary form of a dynamic adjustment of the shim currents of the field coils for the B0 shim in functional multi-slice MR imaging. For this purpose, a firm field determination sequence is created for determining spatial field changes of first or higher orders which must be exactly matched to the corresponding parameters (e.g. slice positions and orientations) of the desired imaging sequence. The field determination sequence records the data necessary for field determination and analyzes them in order to calculate optimized shim currents (of first or higher order) therefrom for each slice to be scanned with the imaging sequence. Subsequently, the imaging sequence is started with the optimized shim currents. The user needs to watch very closely for consistency between the imaging sequence and the field determination sequence since, otherwise, inconsistencies can lead to a worsening of the image quality. Therefore, for each imaging sequence and each change of such a sequence, a new field determination sequence must be created and carried out before the scan with the imaging sequence. These methods are therefore very complex and difficult for the user to combine with other, for example static, adjustments since interactions between different parameters cannot be taken into account or only to a limited extent. If statically adjusted parameters are changed, this can have effects on the optimum dynamic settings of the shim currents and a new field determination sequence and calculation of the optimized shim currents would have to be carried out. Furthermore, the optimization is restricted to the slices of the imaging sequence. Smaller volumes, for example, regional saturation volumes are not taken into account here.

In DE 10 2009 020 661 B4, a method is described with which parameters of a scan sequence, for example in magnetic resonance technology can be adapted at the run time of the scan sequence. Furthermore, it is described therein that different functional subsequences are typically associated with different effective volumes. For each subsequence, a different subvolume of the overall scan volume is relevant.

These kinds of optimizations of values of the sequence control data (parameters) of a scan sequence at the run time of the scan can lead to disruptions in the quality of the recorded data, however, if they adversely affect the data recording.

SUMMARY OF THE INVENTION

An object of the invention is to provide a method for determining time windows in a scan sequence, in which values of sequence control data can be changed during a current scan without adversely affecting the scan data obtained with the scan, a method for operating a medical imaging examination apparatus, and a medical imaging examination apparatus and an electronically readable data carrier encoded with programming instructions, that overcome the described problems.

The invention is based, inter alia, on the insight that parameters of a scan should not be changed during the evolution of useful coherences. The reason for this is that changes to parameters, such as the RF center frequency or shim offset, have direct effects on useful coherences. For example, the effect of a dephasing magnetic field gradient can no longer be compensated by a corresponding rephasing magnetic field gradient, for instance by a refocusing pulse for generating a spin echo, if, in the meantime, a change has occurred to the basic field homogeneity, such as by a change to the offset produced by shimming. A useful coherence in this context means a variable that is to be purposefully manipulated by the scan and the response to this manipulation affects the medical examination data that are to be acquired. An example of a useful coherence of this kind is the transverse magnetization that is manipulated by RF pulses and/or gradient coils and the subsequently recorded raw data.

The object is achieved by a method in accordance with the invention for determining time windows in a scan sequence, in which values of setting parameters can be changed during a current scan without adversely affecting the scan data obtained with the scan that has the following steps. A scan sequence is loaded into a control computer that operates a medical imaging scanner, and time windows in the scan sequence are determined in the control computer in which values of sequence control data can be changed during a current scan on the basis of an analysis of useful coherences in the scan sequence. The determined time windows are stored and/or further processed, and the scan sequence, with those time windows, is made available in electronic form for operating the medical imaging scanner.

The inventive analysis of useful coherences can be easily implemented because the information required for this is already inherently contained in the scan sequence. The inventive method thereby allows time windows in scan sequences, in which setting parameters can be changed, to be determined particularly easily. By determining the time windows, in which setting parameters can be changed, the synchronization of the scanning process with the change in the setting parameters can be facilitated considerably. The determined time windows, moreover, can be used to save energy.

In a simple exemplary embodiment, time windows of the scan sequence, in which values of sequence control data can be changed during a current scan, are ruled out for the duration of a useful coherence recognized during the analysis. This embodiment therefore already prevents these useful coherences from being disrupted by any change in the setting parameters, which would lead to disruptions in the recorded data.

The inventive method allows, by the analysis of useful coherences, the time windows in which setting parameters of scan sequences can be varied without adversely affecting the scan to be easily determined. The scan sequences can thereby be adjusted particularly easily, for example to changed ambient conditions or to other particular requirements.

This applies in the inventive method for operating a medical imaging examination apparatus for recording scan data by execution of such a scan sequence, in which the values of setting parameters of the scan can be changed in time windows determined according to the invention such that the quality of the data recorded by means of the scan is optimized and/or the energy input required for a scan is minimized.

The inventive medical imaging examination apparatus has multiple subsystems and a control computer configured to execute the inventive method. The control device is configured to control the subsystems in a coordinated manner to execute a scan sequence on the basis of sequence control data, wherein the time windows are determined according to the method described above.

An electronically readable data carrier according to the invention is encoded with electronically readable control information (programming instructions) that, when the data carrier is loaded into a control computer of a medical imaging examination apparatus, cause the inventive methods to be implemented.

The advantages and embodiments disclosed with regard to the method apply analogously to the medical imaging examination apparatus and the electronically readable data carrier.

DESCRIPTION OF THE PREFERRED EMBODIMENTS

Figure 1:
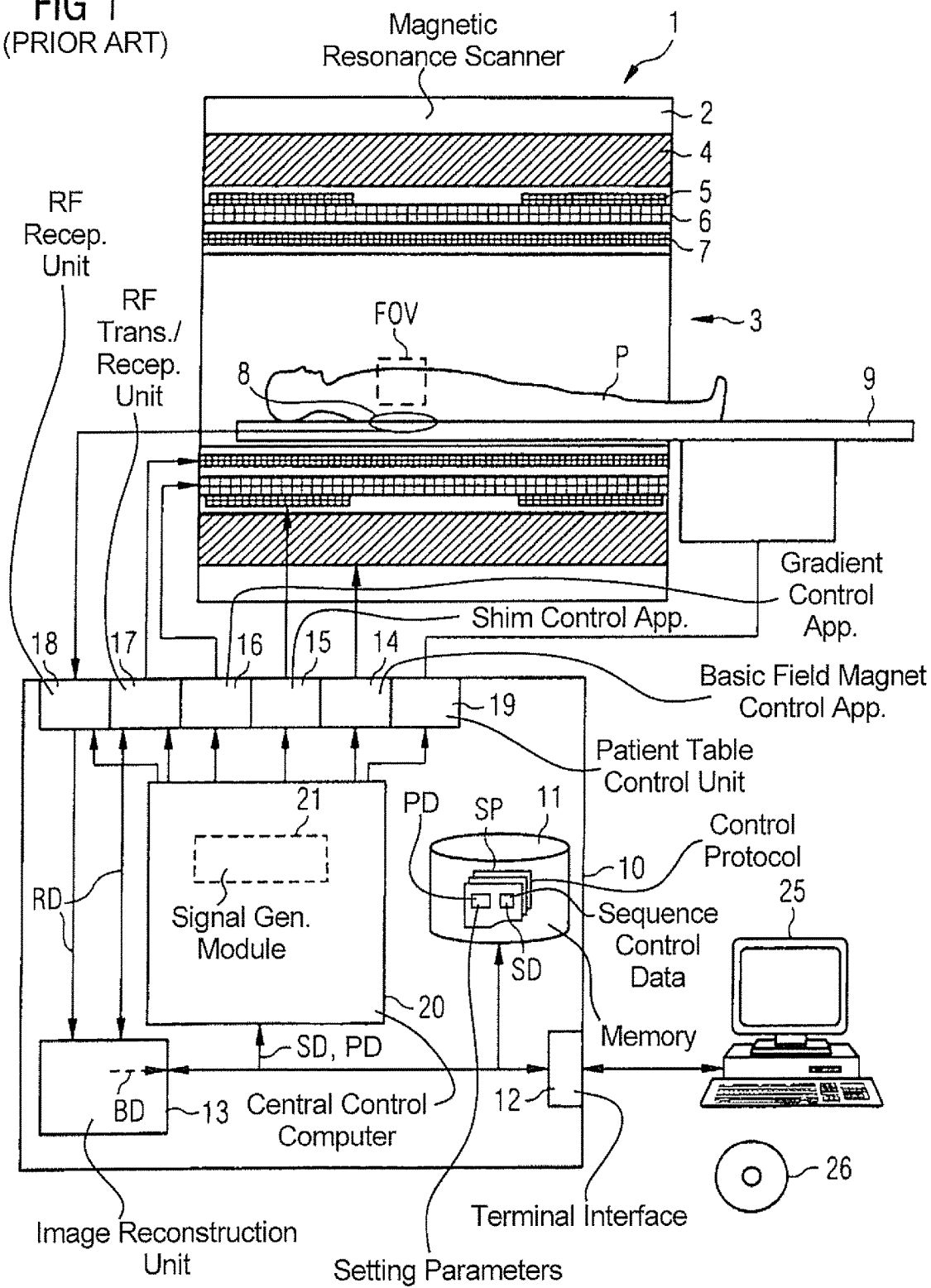
FIG. 1 schematically illustrates an exemplary embodiment of a known medical imaging examination apparatus in the form of a magnetic resonance apparatus.

FIG. 1 shows a basic schematic form of a medical imaging examination apparatus 1 that although the basic components are known, can be configured according to the invention. The apparatus includes the actual magnetic resonance scanner 2 with an examination space 3 or patient tunnel situated therein. A table 9 can be moved into this patient tunnel 3 through various positions so that an examination object, e.g. a patient P or test subject lying thereon can be placed during an examination at a particular position within the magnetic resonance scanner 2 relative to the magnetic system and the radio frequency system arranged therein and is also displaceable between different positions during a scan. It should be mentioned at this point that the exact construction of the magnetic resonance scanner 2 is not essential. Thus, for example, a cylindrical system with a typical patient tunnel can be used, but also a C-arm-shaped magnetic resonance device which is open at one side.

Basic components of the magnetic resonance scanner 2 are a basic field magnet 4, a number of shim coils 5 and magnetic field gradient coils 6 as well as a whole-body radio frequency coil 7. The reception of magnetic resonance signals induced in the examination object can take place by the whole body coil 7, with which typically the radio frequency signals for inducing the magnetic resonance signals are also emitted. It is also possible to receive these signals, for example, with local coils 8 placed on or under the patient. All of these components are known to those skilled in the art and are shown only schematically in FIG. 1.

The individual components are controlled by a control computer 10, which is shown here in the form of a combined block. This can be a control computer that can be composed of a number of individual computers, possibly spatially separated and connected to one another by suitable cables or the like. This control computer 10 is connected, via a terminal interface 12, to a terminal 25, via which an operator can control the entire system 1. The terminal interface 12 should be understood as meaning any connection of input devices, such as a mouse and/or keyboard, and display devices, for example, a screen or monitor of the terminal 25 to the control computer 10.

This control computer 10 has, inter alia, a basic magnetic field control apparatus 14 that monitors the cooling of the basic field magnet, a shim coil control apparatus 15, and a gradient coil control apparatus 16. The whole body coil 7 is controlled by a radio frequency transmission/receiving unit 17. The radio frequency transmitting/receiving unit 17 has, for example, a radio frequency pulse amplifier for amplification and shaping of the radio frequency pulses and a numerically controlled oscillator (NCO) with which the frequency and phase position of the radio frequency pulses can be stipulated. With a further radio frequency receiving unit 18, signals detected by local coils 8 are read out. This radio frequency receiving unit (processor) 18 can include, for example, a coil selection unit in order to select the relevant local coil from among multiple local coils that are available, and an NCO for setting the frequency and phase position. A patient table control unit 19 serves to control the table 9.

The basic field magnet 4, together with its control apparatus 14, the basic magnetic field system 4, 14, the shim coils 5 together with the associated control apparatus 15, the shim system 5, 15, the magnetic field gradient coils 6 with the associated control apparatus 16, the gradient system 6, 16, the radio frequency coils 7 together with their radio frequency transmission/receiving unit 17, form a radio frequency transmission/receiving system 7, 17 and the local coils 8 together with their radio frequency receiving unit 18 form a further radio frequency receiving system 8, 18.

All the control apparatuses 14, 15, 16, 19 and the radio frequency transmitting and/or receiving units 17, 18 are controlled in a coordinated manner by a central control computer 20 so that the basic magnetic fields, gradient fields and radio frequency pulses required for the execution of a scan are output-synchronized, the shim coils are correctly set and the table 9 is in the correct position. Furthermore, it must be ensured that, at the relevant time point, the signals are read out at the local coils 8 by the radio frequency receiving unit 18 and any signals at the whole body coil 7 are read out by the radio frequency transmitting/receiving unit 17 and further processed in an appropriate manner.

The signals or raw data RD acquired in this way are then passed on to an image reconstruction unit 13 in which the desired magnetic resonance image data or spectroscopic data BD are reconstructed in order then to present them on the screen of the terminal 25 or to store them in a memory 11.

The magnetic resonance scanner 2 of this type and the associated control computer 10 also have or can have a number of further components that will not be discussed in detail herein. For example, the examination apparatus 1 can be coupled, via a suitable interface, to a network, for example, a radiological information system (RIS) in order to receive control protocols that can be used in the apparatus 1 or, for example, to transmit magnetic resonance images generated by the apparatus 1, to save them in external mass storage units or to transfer them to diagnosis stations or printers or the like.

The generation of the control signals for the individual control apparatuses 14, 15, 16, 19 and the radio frequency transmitting and/or receiving units 18, 17 by the central control computer 20 is accomplished via a control signal generating module 21, realized in the form of software, in a processor of the control computer 10 that generates control signals on the basis of sequence control data SD that define the different subsequences of the complete scan sequence. An example of a scan sequence composed of multiple subsequences will be described below with reference to FIGS. 3 to 5. The sequence control data SD are typically set within control protocols SP that characterize the scan protocol of the scan to be carried out and can be stored for the apparatus 1 in a memory 11. A control protocol SP of this type contains all the control data necessary for the smooth execution of a particular scan sequence. The operator can select a protocol of this type SP for a scan to be carried out, by a suitable user interface via the terminal 25 and then have the scan performed fully automatically on the basis of this control protocol SP. However, it is also possible for the operator to call and modify a control protocol SP in order to carry out specific scans. It is also possible to select control protocols SP via a further network interface (not shown) on other computers, particularly from the manufacturer of the magnetic resonance system or made available by specialist service providers involved in the development of control protocols.

As explained above, to achieve an optimum image quality it is sometimes expedient if the sequence control data, and the setting parameters PD of a scan sequence, can be adapted to particular requirements during the scanning process, i.e. during a current scan. For this purpose, according to the invention time windows are determined in an arithmetic unit in the control computer 10, without affecting the scan results.

The method described herein can also be in the form of programming instructions encoded in an electronically readable data carrier 26. When the data carrier 26 is loaded in a control device 10 of a medical imaging examination apparatus 1, the programming instructions cause the described method to be executed.

Figure 2:
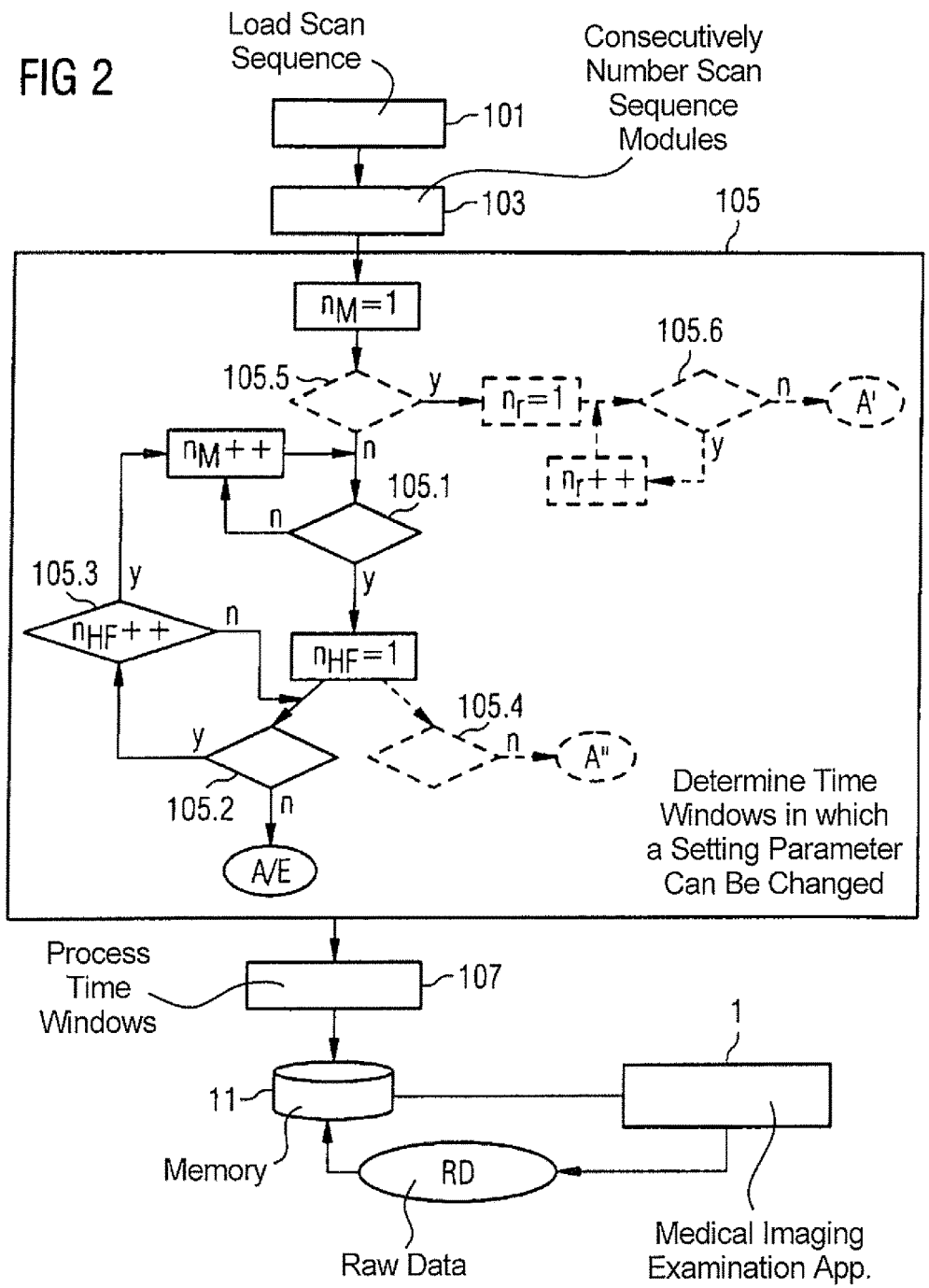
FIG. 2 is a flowchart of the inventive method.

FIG. 2 shows the course of an inventive method for determining time windows in a scan sequence, in which values of setting parameters of a scan can be changed during a current scan without adversely affecting the scan data obtained with the scan.

In a step 101 the scan sequence is loaded into the control computer 10. The scan sequence includes time windows, in which a change in setting parameters is permitted, are to be determined.

Modules of the scan sequence can then optionally be determined that can be numbered consecutively in Step 103, for example by a counter $n_M$. A module means a section of the scan sequence that is intended develop a specific effect in the scan sequence. Examples of modules of this kind are modules for a regional saturation, modules for a chemically selective saturation, excitation modules, phase encoding modules, readout modules, etc. When the scan sequence for determining the time windows is divided into modules, the useful coherences can be analyzed module-by-module. Specific time windows or start and/or end points of time windows can also be stored in a module and used for any other sequence that uses a similar module, without renewed determination.

The time windows in the loaded scan sequence, in which windows setting parameter PD can be changed, are determined in a step 105 on the basis of an analysis of useful coherences in the scan sequence. In a simple exemplary embodiment, the time windows can be ruled out from inclusion in the sought time windows, for the duration of a useful coherence recognized during the analysis. Therefore, the time windows to be determined can only be in periods in which there are no useful coherences.

Determining the time windows can therefore include querying radio-frequency pulses 105.1 in the scan sequence. The radio-frequency pulses of the scan sequence or, if there is a division into modules, of the module $n_M$ of the scan sequence, can be consecutively numbered by a counter $n_{HF}$. When the first radio-frequency pulse is found ("y"), then it can be determined in query 105.2 whether the radio-frequency pulse should have an effect on an existing useful coherence. Determining the time windows therefore includes a query 105.2 as to a desired effect on an existing useful coherence of a radio-frequency pulse of the scan sequence. If a useful coherence has still not been determined, then this results in negative answer ("n"). If useful coherences were found during the analysis, then this query is answered by the type of radio-frequency pulse and the type of scan sequence. For example, a designation if an excitation radio-frequency pulse should routinely not have an effect on an existing useful coherence during spin echo scan sequences and should instead create a new situation and therewith a new useful coherence. The same applies to preparation radio-frequency pulses. With gradient echo scan sequences, for example with turbo-gradient echo sequences, in which the same volume is repeatedly excited with the excitations occurring immediately one after the other, or with steady-state gradient echo sequences, such as TrueFISP, it is often only the first excitation radio-frequency pulse that should not act on an existing useful coherence. The same applies to refocusing radio-frequency pulses. The desired effect of the radio-frequency pulses is therefore inherent to the respective scan sequence and can be readily allocated.

If the query 105.2 is answered in the negative ("n") it can be established that a time window to be determined ends with the start of the radio-frequency pulse $n_{HF}$ ("E"). In a simple exemplary embodiment, the start of the module $n_M$ being considered or, if present, the end of the previous module $n_{M-1}$ can be set as the start of the time window "A" (see below also in relation to FIG. 3). In these cases, for determining the time windows it is sufficient to consider those modules which comprise at least one radio-frequency pulse which should not act on an existing useful coherence.

If the query 105.2 is answered in the affirmative ("y"), the counter $n_{HF}$ can be incremented by one ("$n_{HF}$++") and the next radio-frequency pulse considered. As each radio-frequency pulse of the module nM is considered (query 105.3), the counter of the modules $n_M$ is incremented by one ("$n_M$++") and the next module considered, until all modules have been considered. When all radio-frequency pulses of the scan sequence have been considered, determining end points of the time windows ends.

A query (not shown) can also be incorporated for each identified end point of a time window, and this establishes whether a change in values of used setting parameters is expedient. If this is not the case, the next time window can be sought directly without making a change to the setting parameters. If a change is expedient it can also be checked how long the change in the values of the setting parameters will last. The required duration for a change in the values of the setting parameters results here from the type of setting parameters and hardware used.

In some cases it is already enough, as described above, to determine an end point of a time window, wherein the start point of the time window can then be set so as to be the same as the end point of the time window. The determined time window is therefore a time window with length "zero", i.e. more or less just one instant.

This is expedient in particular if the duration of the change in the desired setting parameters is "zero", i.e. if the value of the setting parameter or the values of the setting parameters may change instantaneously.

If the duration required for a change in setting parameters is not zero, the start point of the time window can be explicitly determined and it can be checked whether the determined time window in the scanning process is of sufficient duration for the change. If so, the changes in this time window can be carried out.

If the determined time window is not long enough for the desired changes in the setting parameters, the determined time window can be lengthened, for example by inserting intervals in the scanning process, to create a sufficiently long time window so the changes can be carried out.

A check of this kind can be carried out, for example by the user, as early as during the course of editing the scanning protocol to be able to take into account effects of the optionally necessary additional time windows (intervals) on the sequence timing (for example adjustable TR).

To make optimum use of an attainable length of the time windows to be determined it is therefore advantageous to explicitly determine the respective beginning of the time windows. For this purpose, a query 105.4 can determine whether the radio-frequency pulse nRF should continue to use a useful coherence excited or manipulated by the radio-frequency pulse of the scan sequence. Determining the time window thus includes a query 105.4 of a desired further use of a useful coherence excited or manipulated by the radio-frequency pulse of the scan sequence. If this is not the case, a start point A" of the next time window to be determined is after the end of the radio-frequency pulse $n_{hf}$.

A further possibility of explicitly determining the beginning of a time window can lie by querying, in 105.5, a data-readout operation in the scan sequence or in the module $n_M$. The existing readout processes can be consecutively numbered for this purpose by a counter $n_r$. For each readout process $n_r$ it can then be checked in query 105.6 whether a useful coherence read out by a data-readout operation should still be used after the readout process. Determining the time windows therefore includes querying 105.6 of a desired further use of a useful coherence read out by a data-readout operation. If so ("y"), the counter $n_r$ is increased by one ("$n_r$++"), and the next readout process considered. If this is answered in the negative ("n"), a start point A' is at the end of the readout operation $n_r$.

With module-by-module determination of the time windows it is sufficient to consider those which include at least one radio-frequency pulse and/or at least one readout operation. This simplifies the integration of optimization methods, in particular dynamic adjustment methods, in the scanning process considerably.

Such explicit determining of the start points of the time windows, and therewith maximization of the lengths of the time windows, means that critical setting parameters, which are subject for example to hardware-based limitations and cannot be changed instantaneously, can be optimally adjusted during a current scan. This applies to setting parameters, subject to minimum switching times, such as for example with changes in currents in the case of inductive loads such as the gradient coils. The limitations, and the required periods, are known in this connection. If a determined time window should still not be enough to carry out a desired change in setting parameters, the entire scan sequence can also be lengthened by inserting an "interval" so the affected time window attains the required length. This can happen automatically.

The determined time windows are stored in a memory 11 and/or processed further in a step 107. The determined time windows can be used in methods for operating a medical imaging examination apparatus 1 for recording scan data by execution of a scan sequence so as to be able to change setting parameters of the scan in the time windows in such a way that the quality of the data RD recorded by the scan is optimized and/or so that an energy input required for a scan is reduced. To reduce the energy input, the shim offset currents, for example, can be reduced or set at zero. Such an energy saving reduces the costs of the scan.

Figure 3:
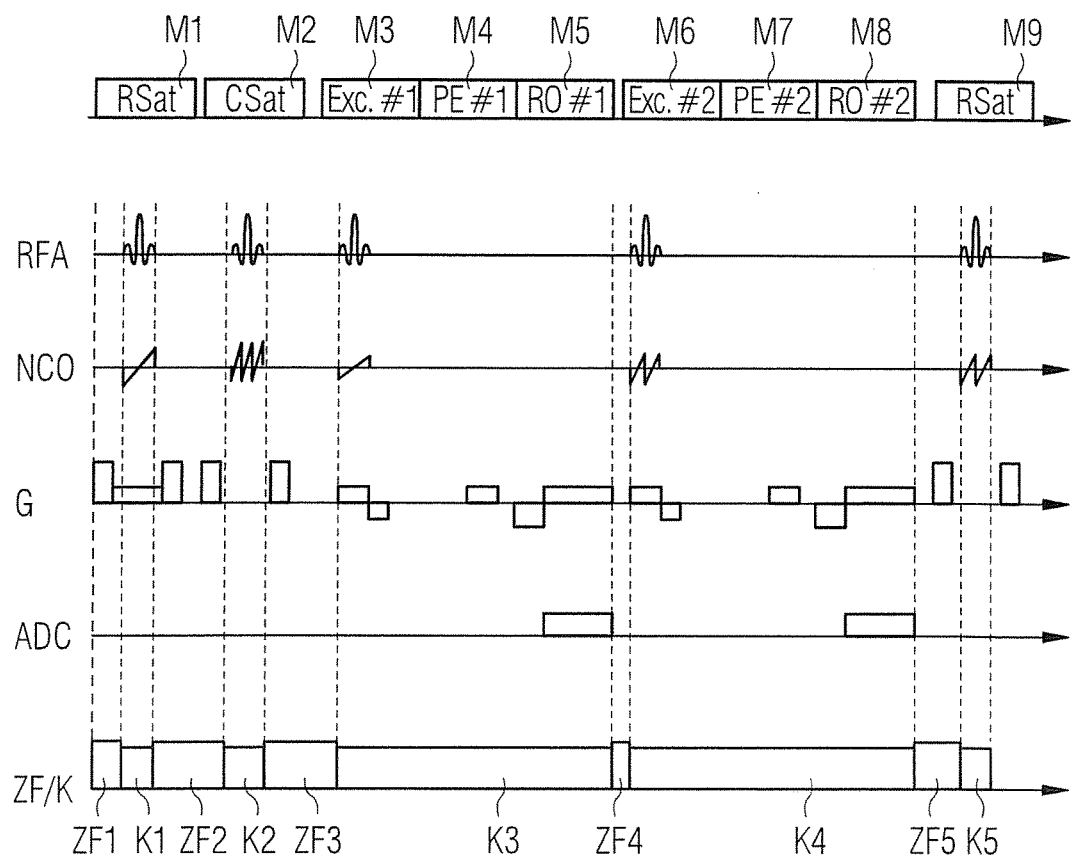
FIG. 3 shows a simplified exemplary embodiment of part of a scan sequence having multiple modules and associated time windows.

FIG. 3 shows a highly simplified exemplary embodiment of part of a scan sequence having a number of modules and associated time windows.

The first rows show different modules M1, M2, ... M9. The rows below show the respective amplitudes of the radio-frequency pulses (RFA), the NCO signal controlling the phases and frequencies of the radio-frequency pulses, the switched gradients G, the readout processes ADC and finally in the bottom row the time windows ZF1, ZF2, ... ZF5 and useful coherences K1, K2, ... K5.

Module M1 identifies a regional saturation; module M2 a chemically selective saturation. The two modules M1 and M2 contain a radio-frequency pulse which should not act on an existing useful coherence, and thereby itself starts a new useful coherence K1 and K2 in each case. The useful coherences K1 and K2 generated by the radio-frequency pulses of the modules M1 and M2 respectively end again with the end of the respective radio-frequency pulse and therefore each start an optimally long time window ZF2 and ZF3. The time window ZF1 begins without explicit determination of its onset by the start of the scan, and the start of the module M1. As may be seen, an "interval" or a waiting time, for example, can be inserted between the modules M1 and M2 and between the modules M2 and M3. If the start point of the time windows ZF2 and/or ZF3 was not explicitly determined, the start point of these time windows could for example be set at the start of the respective module M2 or M3, or else with knowledge of the inserted "interval" could be brought forward by this amount and the time windows ZF2 and/or ZF3 lengthened slightly therefore. For clarity, FIG. 3 shows only time windows of optimum length. Only time windows of optimum length will be considered below.

Module M3 shows an excitation of a slice and includes an excitation radio-frequency pulse that should not act on an existing useful coherence, but in turn generates a new useful coherence K3. The time window zf3 before module M3 thereby ends with the beginning of the radio-frequency pulse of module M3. The useful coherence K3 generated here continues to be used, however. A new time window still does not start after the radio-frequency pulse of the module M3 therefore.

Module M4 relates to the phase encoding of the excited slice and includes neither a radio-frequency pulse nor a data-readout process. It is not relevant to the determination of the time windows therefore.

Module M5 includes a data-readout process. The existing useful coherence K3 should not be used further after the readout process, however. A new time window ZF4 therefore begins with the end of the readout process ADC of module M5.

Modules M6, M7 and M8 repeat the processes of modules M3, M4 and M5 for a different slice. A new useful coherence K4 is generated with the radio-frequency pulse of the module M6. The time window ZF4 ends therefore with the beginning of the radio-frequency pulse of the module M6. Analogously to module M4, module M7 is not relevant to the determination of the time windows either. Analogously to module M5, the existing useful coherence K4 is not used further after the readout process of module M8. The useful coherence K4 ends therefore with the end of the readout process of the module M8. A new time window ZF5 begins at the same time.

Module M9 again shows a regional saturation whose radio-frequency pulse ends the time window ZF5 since it does not act on the existing useful coherence K4 but generates a new useful coherence K5.

In the illustrated example, gradient offset currents, as are specified and set for example by the previously used "static" adjusting methods for the homogenization of the B0 field, could be set to zero, for example, in the determined time windows ZF1-ZF5 to reduce the energy that needs to be employed for the scan.

Although modifications and changes may be suggested by those skilled in the art, it is the intention of the inventor to embody within the patent warranted hereon all changes and modifications as reasonably and properly come within the scope of his contribution to the art.

We claim:

1. A method for determining time windows within a scan sequence comprising:

loading a scan sequence into a control computer that will be used by the control computer to operate a medical data acquisition apparatus;

in said control computer, determining time windows in said scan sequence in which values of setting parameters can be changed during an execution of said scan sequence by said medical data acquisition device without adversely affecting scan data acquired with said scan sequence, by analyzing useful coherences in the scan sequence; and in said control computer, performing at least one of storage or further processing of said determined time windows, and making the scan sequence with the determined time windows therein available as an electronic signal from said control computer for operating said medical examination data acquisition device.

2. A method as claimed in claim 1 comprising, when analyzing said useful coherences, identifying a duration of each useful coherence and, during said duration, ruling out the time window in which said useful coherence occurs as a time window in which parameters of the scan sequence can be changed.

3. A method as claimed in claim 1 comprising dividing said scan sequence into modules and analyzing each module with regard to said useful coherences.

4. A method as claimed in claim 1 comprising determining said time windows as including time windows in which radio-frequency pulses are radiated in said scan sequence.

5. A method as claimed in claim 4 comprising determining said time windows by at least one of querying a desired effect on an existing useful coherence of a radio-frequency pulse radiated in said scan sequence, and querying a desired further use of a useful coherence that is excited or manipulated by a radio-frequency pulse radiated in said scan sequence.

6. A method as claimed in claim 1 comprising determining said time window by querying a data-readout operation in said scan sequence.

7. A method as claimed in claim 6 comprising determining said time window by querying a desired further use of a useful coherence read out by a data-readout operation.

8. A method for determining time windows within a scan sequence comprising:
loading a scan sequence into a control computer that will be used by the control computer to operate a medical data acquisition apparatus;
in said control computer, determining time windows in said scan sequence in which values of setting parameters can be changed during an execution of said scan sequence by said medical data acquisition device without adversely affecting scan data acquired with said scan sequence, by analyzing useful coherences in the scan sequence; and
from said control computer, operating said medical examination data acquisition device according to said scan sequence and changing values of said setting parameters in the determined time windows to optimize said scan data or reduce an energy input to said medical examination data acquisition device during execution of said scan sequence.

9. A medical imaging examination apparatus comprising:
a medical examination data acquisition device adapted to receive an examination subject therein;
a control computer loaded with a scan sequence that will be used by the control computer to operate a medical data acquisition apparatus;
said control computer being configured to determine time windows in said scan sequence in which values of setting parameters can be changed during an execution of said scan sequence by said medical data acquisition device without adversely affecting scan data acquired with said scan sequence, by analyzing useful coherences in the scan sequence; and
said control computer being configured to perform at least one of storage or further processing of said determined time windows, and to make the scan sequence with the determined time windows therein available as an electronic signal from said control computer to operate said medical examination data acquisition device.

10. A medical imaging examination apparatus as claimed in claim 9 wherein said medical imaging examination apparatus is a magnetic resonance data acquisition apparatus.

11. A non-transitory, computer-readable data storage medium encoded with programming instructions, said storage medium being loaded into a control computer of a medical imaging examination apparatus having a medical image data acquisition device, said programming instructions causing said control computer to:
receive a scan sequence into a control computer that will be used by the control computer to operate a medical data acquisition apparatus;
determine time windows in said scan sequence in which values of setting parameters can be changed during an execution of said scan sequence by said medical data acquisition device without adversely affecting scan data acquired with said scan sequence, by analyzing useful coherences in the scan sequence; and
perform at least one of storage or further processing of said determined time windows, and make the scan sequence with the determined time windows therein available as an electronic signal from said control computer for operating said medical examination data acquisition device.

\* \* \* \* \*